United States Patent [19]
Yablonovitch

[11] Patent Number: 4,804,639
[45] Date of Patent: Feb. 14, 1989

[54] METHOD OF MAKING A DH LASER WITH STRAINED LAYERS BY MBE

[75] Inventor: Eli Yablonovitch, Scotch Plains Township, Union County, N.J.

[73] Assignee: Bell Communications Research, Inc., Livingston, N.J.

[21] Appl. No.: 117,289

[22] Filed: Nov. 4, 1987

Related U.S. Application Data

[63] Continuation of Ser. No. 853,613, Apr. 18, 1986, abandoned.

[51] Int. Cl.[4] .......................................... H01L 21/306
[52] U.S. Cl. ........................ 437/129; 148/DIG. 72; 148/DIG. 95; 148/DIG. 97; 148/DIG. 169; 148/33.1; 148/33.5; 156/612; 357/17; 372/45; 437/107; 437/128; 437/133; 437/969
[58] Field of Search .................. 148/DIG. 56, 65, 67, 148/72, 95, 110, 119, 169, 97, 33.1, 33.5; 156/610-615; 357/16, 17; 372/44-46; 350/96.12; 437/126, 107, 127, 128, 129, 133, 905, 969

[56] References Cited

U.S. PATENT DOCUMENTS

| | | | |
|---|---|---|---|
| 3,966,513 | 6/1976 | Hallais et al. | 437/126 |
| 4,016,505 | 4/1977 | Itoh et al. | 357/16 |
| 4,034,311 | 7/1977 | Itoh et al. | 372/45 |
| 4,144,503 | 3/1979 | Itoh et al. | 331/94.5 H |
| 4,152,044 | 5/1979 | Liu | 350/96.12 |
| 4,392,227 | 7/1983 | Itoh et al. | 372/46 |
| 4,546,480 | 10/1985 | Burnham et al. | 372/46 |
| 4,569,721 | 2/1986 | Hayakawa et al. | 437/129 |
| 4,607,368 | 8/1986 | Hori | 372/45 |
| 4,612,645 | 9/1986 | Liu et al. | 357/17 |
| 4,630,083 | 12/1986 | Yamakoshi | 357/17 |
| 4,648,095 | 3/1987 | Iwasaki et al. | 372/44 |
| 4,701,774 | 10/1987 | McIlroy et al. | 357/17 |
| 4,740,978 | 4/1988 | Göbel et al. | 372/46 |

OTHER PUBLICATIONS

"Compensation of Internal Thermal Stresses in In-GaAsP/InP Laser for Polarization Stabilization", J. M. Liu et al., *IEEE Journal of Quantum Electronics*, vol. 21, No. 3, Mar. 1985 (New York, USA) pp. 271-277.

"Anisotropy and Broadening of Optical Gain a GaAs-/AlGaAs Multiquantum Well Laser", M. Yamada et al., *IEEE Journal of Quantum Electronics*, vol. 21, No. 6, Jun. 1985, pp. 640-645.

"Continuous 300°-K Laser Operation of Strained Super Lattices", M. J. Ludowise et al., *Applied Physics Letters*, vol. 42, No. 6, 15 Mar. 1983 (New York, USA), pp. 487-489.

*Primary Examiner*—Brian E. Hearn
*Assistant Examiner*—William Bunch
*Attorney, Agent, or Firm*—James W. Falk

[57] ABSTRACT

A method of making a semiconductor laser from a gallium arsenide substrate of a first conductivity type by depositing a first layer of semiconductor material having the composition $Al_xGa_{1-x}As$ of first conductivity type on the substrate and a thin second layer of semiconductor material for quantum confinement having the composition $In_yGa_{1-y}As$ on the first layer. This layer experiences sufficient strain in the semiconductor structure so as to minimize the threshold current density. The device is completed by depositing a third layer of semiconductor material having the composition $Al_xGa_{1-x}As$ and of second conductivity type on the second layer, and depositing a fourth layer of semiconductor material having the composition GaAs and of second conductivity type on the third layer.

8 Claims, 1 Drawing Sheet

METHOD OF MAKING A DH LASER WITH STRAINED LAYERS BY MBE

This is a continuation of application Ser. No. 853,613 filed Apr. 18, 1986 now abandoned.

BACKGROUND OF THE INVENTION

1. Field of the Invention

The invention relates to the fabrication of semiconductor laser devices, and in particular the use of molecular beam epitaxial techniques to produce sequential layers of strained crystalline material for use in laser devices having improved threshold current density characteristics.

2. Description of the Prior Art

The use of strained layers in semiconductor devices is shown in the prior art for a limited number of applications. In U.S. Pat. No. 4,376,138, a waveguiding layer is created by an n-type InP epitaxial layer on an $n^+$-InP substrate. The lateral confinement of the radiation is achieved through the strain induced in the epitaxial layer by a thick metal film which cools upon evaporation. Strain in a semiconductor layer is analogous to the deformation of an elastic body under mechanical stretching action. In a semiconductor body, a lattice mismatch between adjacent epitaxial layers results in a displacement of atoms in the crystal structure which may be defined as a strain. Such displacement of atoms in a plane parallel to the major surface of the layer typically results in modified electrical properties of the strained layer.

In U.S. Pat. No. 4,445,965 a method for making thin film cadmium telluride and related semiconductors for solar cells is described. In such a technique, a semiconductor sandwich is attached to a rigid supporting substrate such as glass by a suitable adhesive and strain is applied so that the thin telluride layer fractures and the desired thin film, cadmium telluride layer is obtained attached to a supporting glass substrate.

In the article "Lasing Transitions in GaAs/GaAs$_{1-x}$P$_x$ Strained-Layer Superlattices with x=0.1-0.5", P. L. Gourley, J. P. Hohimer, and R. M. Biefeld, Appl. Phys. Lett. Vol. 47(6) Sept. 15, 1985, pp. 552-554, the role of strain in modifying lasing transition energy and gain coefficient in photopumped GaAs/GaAs$_{1-x}$P$_x$ strained-layer superlattices is investigated by examining photoluminescene, excitation, and lasing spectra for sample with x in the range 0.1-0.5. However, such prior art is directed to devices having an increase of laser gain rather than a reduction of laser threshold current density. Furthermore, the predicted increase in gain, in the prior art is for an electric polarization orthoganal to the polarization in which the threshold current is actually reduced. Moreover, the amount of strain used in such prior art is, in fact, insufficient to appreciably affect the current density. In addition, the devices described in such prior art use a complex multiple layer superlattice structure rather than a single active layer. In summary, prior to the present invention, there has not been a semiconductor laser device structure in which strain introduced in a layer of the device has reduced the lase threshold current density of the laser.

SUMMARY OF THE INVENTION

Briefly, and in general terms, the present invention provides a method of making a semiconductor laser device by providing a gallium arsenide substrate of a first conductivity type; and depositing a first layer of semiconductor material having the composition Al$_x$Ga$_{l-x}$As of first conductivity type of the substrate. A thin active second layer of semiconductor material for quantum confinement having the composition In$_y$Ga$_{l-y}$As is deposited on the first layer, thereby inducing sufficient strain in the device so as to minimize the threshold current density. A third layer of semiconductor material having the composition Al$_x$Ga$_{l-x}$As and of second conductivity type is deposited on the second layer. A fourth layer of semiconductor material having the composition GaAs and of second conductivity type is then deposited on the third layer.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawing.

BRIEF DESCRIPTION OF THE DRAWING

FIG. 1b is an energy level diagram of the device shown in FIG. 1a.

DESCRIPTION OF THE PREFERRED EMBODIMENT

The present invention provides a semiconductor laser having a layered structure which employs strain and quantum confinement to diminish the valence band mass and the lasing threshold current requirements of the laser.

The basic method of making a semiconductor laser is to grow a semiconductor crystal layer structure with a specific doping and chemical composition of the layers. Once such a crystal wafer is grown, the cleaving of the crystal into individual lasers and the provision of electrical contacts to each laser is well known to those skilled in the semiconductor laser art. Therefore, the present description focuses on the growth of the multiple layer structure on the semiconductor crystal wafer which forms the present invention.

The starting point of fabricating the semiconductor laser according to the present invention is to provide a crystal wafer of gallium arsenide (GaAs) oriented in the <100< direction.

There are a number of acceptable methods of crystal growth which are well known to those skilled in the semiconductor laser art. These include molecular beam epitaxy (MBE), metallo-organic chemical vapor deposition (MOCVD) and liquid phase epitaxy (LPE). Any of these methods of producing the desired crystal layer structure is acceptable.

Figure 1A:
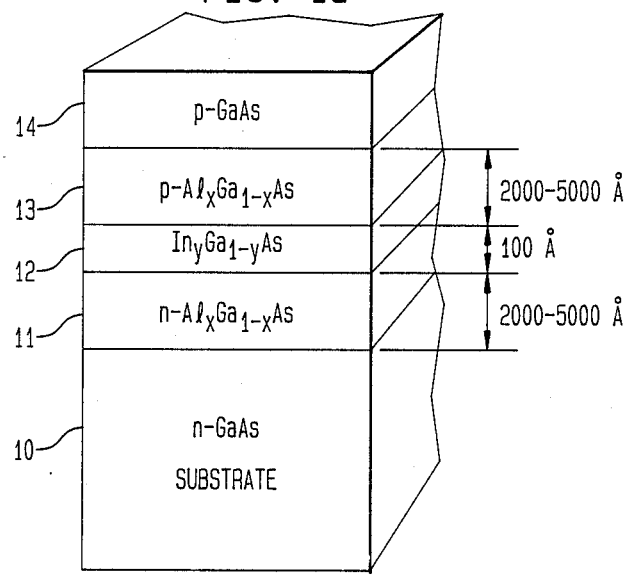
FIG. 1a is a highly simplified cross-sectional view of a semiconductor laser device having a layered structure according to the present invention.
Figure 1B:
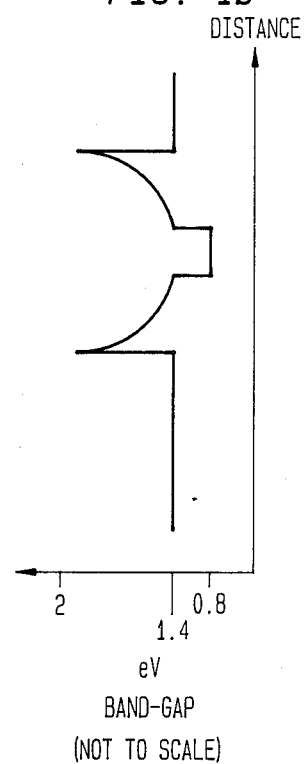

The semiconductor device according to the present invention is illustrated in FIG. 1a. The device has a layered structure which results in a significantly lowered threshold current density. The bandgap energy level structure of the layers of the device is shown in FIG. 1b. The device according to the present invention is based upon the utilization of an n-type GaAs substrate 10, shown in FIG. 1a.

The first layer to be grown on the n-type GaAs substrate is a layer 11 of composition Al$_x$Ga$_{l-x}$As, also of n-type conductivity. The growth begins with an aluminum fraction x between 10% and 50% adjacent to the substrate 10 and grades down to a composition of 0% aluminum at the surface. The purpose of this layer 11 is to provide optical wave-guiding in the semiconductor laser. As is well known to those skilled in the semiconductor laser art, the exact composition profile of the wave-guiding layer is not critical provided that the overall thickness of the wave-guiding structure is such as to support a single optical mode between the two wave-guiding layers.

The next layer is grown on top of layer 11 and is an undoped layer 12 having a composition $In_yGa_{1-y}As$ where the indium concentration y is approximately 50%, the exact value of which is determined by the desired lasing wavelength and the need for strain. This layer 12 is the active layer of the device and is preferably less than 100 o/A thick. The layer 12 functions to provide quantum confinement. Such quantum confinement changes the energy levels and the band structure of the electrons in the material and in effect causes the material to exhibit artifically induced, new properties. The concentration y should be large enough so that the strain term $Bb(e_{xx}-e_{zz})$ counteracts the $(2B^2+C^2)(l\pi/d)^2$ quantum confinement term. The meaning of these symbols will be explained later in this patent application. The inclusion of strain further modifies in an artificial manner the energy levels and properties of the electrons in the material. A concentration y around 50% will provide about 3.7% strain which is sufficient to satisfy this requirement.

Another $Al_xGa_{1-x}As$ layer 13 is now grown on top of laeyr 12 for optical waveguiding purposes, which should be p-type. This layer is grown as a mirror image to the other $Al_xGa_{1-x}As$ layer in that the aluminum concentration x starts at zero and adjacent the layer 12 and incresaes to a concentration between 10% and 50% at its upper major surface. In this way, the two $Al_xGa_{1-x}As$ layers 11 and 13 can form an ideal parabolic index of refraction profile with very favorable waveguiding properties, as mentioned earlier.

The final layer 14 is epitaxially grown on top of layer 13 and may preferably be p-type GaAs to facilitate making ohmic contact to the $Al_xGa_{1-x}As$ layer 13.

It is to be understood that in the specific illustration in FIG. 1a many changes can be made without affecting the improved laser performance. The polarity of the n and p-type regions can all be reversed. Furthermore, the undoped active layer can be doped significantly with either conductivity type without harm. The arrangement of the layers and the distribution of strain within the layers can be significantly altered without affecting the final outcome. The key requirement that must be satisfied is that the strain term in the active layer $(Bb(e_{xx}-e_{zz})$ should counteract the $(2B^2+C^2)(l\pi/d)^2$ quantum confinement term.

Among the modifications of the structure shown in FIG. 1a which are within the scope of the present invention are the addition of thin 50 o/A counter-strain layers of GaP on either side of the active strained layer. The whole structure may also be modified by starting with a substrate of a different lattice constant and making the layers of different quanternary alloys.

The amount of improvement in the threshold current density to be expected can be estimated from an analysis to be presented below. The most serious parasitic recombination mechanism which contributes to the threshold current is Auger recombination, which depends on the cube of carrier density. The carrier density at threshold is expected to be diminished by a factor two due to the reduction in valence band mass. Therefore, the threshold current may be expected to be diminished by a factor eight. An eight-fold reduction in current density is quite significant.

In the III-V class of semiconductor lasers there is a serious asymmetry between the very light conduction band mass and the heavy valence band mass. As a result, the usual semiconductor laser picture of a degenerate distribution of both electrons and holes does not actually apply. The upper lasing levels in the conduction band are filled with the degenerate electrons but the lower lasing levels in the valence band are not empty. Due to the heavy valence and band mass, the hole quasi-Fermi level is above the top of the valence band and the hole distribution is classical. Therefore the hole occupation probability at the top of the valence band is small, i.e., the lower laser levels are almost completely filled with electrons.

Present day semiconductor lasers find themselves in the awkward position of lasing down from filled states to almost filled states. This is far from optimal. The more ideal situation of equal conduction and valence band mass is shown in FIG. 1(b). The penalty associated with the effective mass asymmetry may be estimated, and the effectiveness of a strain perturbation in shifting the light hole band above the heavy hold band may be analyzed. This would reduce the valence band edge effective density of states and minimize this asymmetry.

The penalty associated with the effective mass asymmetry is especially severe in a three-dimensional active layer. The ratio of density of states between valence and conduction band is proportional to $(m_h/m^c)^{3/2}$ where $m_c$ is the light conduction band mass and $m_n$ is the heavy valence band mass. (We neglect, for this discussion, the light valence band mass $m_l$ since its contribution is overwhelmed by the heavy band.) In a quantum confined active layer the density of states asymmetry is less severe but still proportional to $(m_h/m_c)$. We will analyze the penalty associated with a two-dimensional (x,y) active layer having quantum confinement in the z direction. The two-dimensional density of states per unit carrier energy per unit area is $m/\pi h^2$ and is independent of carrier energy.

The threshold condition for gain is the wellknown Bernard-Duraffourg condition:

$$(F_c - F_v) > hu \geq E_g \qquad (1)$$

which requires that the separation of quasi-Fermi levels $(F_c - F_v)$ should be greater than the bandgap. In practice the quasi-Fermi level separation should exceed the minimal value by 1 or 2 kT in order to overcome cavity losses, etc. but this would not change any of our conclusions. The carrier injection level n per unit area required to produce the quasi-Fermi level separation is:

$$n = \int_0^x \frac{1}{\exp\{E/kT\} + 1} \frac{m_c}{\pi h^2} dE$$

$$n = \frac{kT\, m_c}{\pi h^2} \ln 2$$

The electrons are degenerate and their density is given by $n = m_c \Delta/\pi h^2$, where $\Delta$ is degeneracy energy.

The holes are nondegenerate and their density p can be approximated by:

$$p = \frac{kT\, m_h}{\pi h^2} \exp\left(-\frac{\Delta}{kT}\right)$$

Equating n and p results in an equation for $\Delta/kT$ which can be solved iteratively on a hand calculator:

$$\left[\frac{\Delta}{kT}\right]\left[\frac{m_c}{m_h}\right] = \exp\left(-\frac{\Delta}{kT}\right) \tag{2}$$

A reasonable value for $(m_c/m_h)$ is 1/6 which results in a value for $\Delta = 1.43\, kT$. Therefore, the ratio of injection level in the two cases is 1.43/ln2 which is a factor greater than 2. In a fully three-dimensional active region the penalty is even more severe.

The threshold current $J_{th}$ in a semiconductor laser must compensate (a) spontaneous emission $J_{sp}$, (b) nonradiative surface recombination on the two faces of the active region 2qnS, and (c) nonradiative Auger recombination $q\nu n^3 d$:

$$J_{th} = J_{sp} + 2qnS + q\nu n^3 d \tag{3}$$

where q is the electronic charge, S is the surface recombination velocity, $\nu$ is the Auger recombination coefficient and d is the thickness of the active layer. It is clear from the second and third terms of equation (3) that any reduction in carrier injection level n will immediately result in a reduction of threshold current density. This is especially true for Auger recombination which is particularly serious for longer wavelength lasers.

It might also seem that $J_{sp}$ would also benefit from a reduction in n, but this would be largely incorrect. The spontaneous emission is directly linked to the required laser gain by a fundamental formula which is largely independent of any microscopic properties of the analogous to the Einstein A and B relations and which is gain medium:

$$J_{sp} = 8\pi q g d \Delta \nu / \lambda^2 \tag{4}$$

where g is the gross gain the active region uncorrected for absorption, $\lambda$ is the wavelength in the medium and $\Delta \nu$ is the spontaneous emission bandwidth. For a given gain, the main leverage on $J_{sp}$ is via the emission bandwidth, but this tends to always be few kT wide. For example at the room temperature injection levels required for lasing, quantum confined excitons tend to have broad emission bands smeared together with the band-to-band emission. Nevertheless, quantum confined active layers do tend to have somewhat narrower spontaneous emission bandwidths $\Delta \nu \approx 3$ or $4\, kT/h$ than do thick layers.

The main conclusion from the above discussion is that a reduction of valence band effective mass can reduce injection levels required or lasing and have a favorable effect on the threshold current via equation (3). Now let us see how the effective mass can be reduced by strain in a quantum confined layer. We have in mind to lift the k=0 degeneracy between light and heavy holes in the valence band of a ternary or quanternary semiconductor. If the light valence band can be shifted upward then its effective mass would determined the band edge density of states. This will occur in a strained active layer grown on a substrate whose lattice constant is smaller than the active layer would ordinarily prefer to grow.

The effect of strain on the valence band structure of semiconductors was first analyzed in, "Effect of Deformation on the Hole Energy Spectrum of Germanium And Silicon", G. E. Pikus and G. L. Bir, Soviet PhysicsSolid State, Vol. 1, pp. 1502–1517 (1959). As is usual, we neglect band structure terms linear in k which are very small in the III-V semiconductors. The effect of strain is to mix the light and heavy valence bands whose energy is now given by:

$$E = A|k|^2 \pm (E_e^2 + E_k^2 + E_{ek}^2)^{\frac{1}{2}} \tag{5}$$

$$E_k^2 = B^2|k|^4 + C^2(k_x^1 k_y^2 + k_x^2 k_z^2 + k_y^2 k_z^2) \tag{5a}$$

$$E_e^2 = b^2 (e_{xx} - e_{zz})^2 \tag{5b}$$

$$E_{ek}^2 = Bb(e_{xx} - e_{zz})(k_x^2 + k_y^2 - 2k_z^2) \tag{5c}$$

where we have specialized to the case of strain $e_{xx} = e_{yy}$ and have ignored shear strain and the hydrostatic term which shifts both bands uniformly. The plus and minus before the square root represent the heavy and light bands respectively. A, B and C are the reciprocal effective mass co-efficients and b is the deformation potential. If the strain in the x-y plane is compressive then the isoenergy surface in K-space is as shown in FIG. 2. The highest valence band will be heavy in the z-direction and relatively light in the x-y plane.

Since the quantum confined layer cannot be grown arbitrarily thick, let us introduce quantum confinement in the z direction by restricting k to the values $\pm \pi/d$, when l is an integer. This is equivalent to assuming infinitely high potential barriers. Then equation (5) can be expanded in a power series in $k|^2| = k_x^2 + k_y^2$ $$E = A(l\pi/d)^2 \pm \{B(l\pi/d)^2 - b(e_{xx} - e_{zz})\} + (A \pm T)k|^2| \tag{6}$$

and where $$\pm T = \frac{(2B^2 + C^2)(l\pi/d)^2 + Bb(e_{xx} - e_{zz})}{\pm 2\{B(l\pi/d)^2 - b(e_{xx} - e_{zz})\}} \tag{7}$$

Since the valence bands turn down, A is negative and we desire to make the reciprocal effective mass $A \pm T$ as negative as possible. In addition, we seek out the highest lying valence band for which $\pm \{B(l\pi/d)^2 - b(e_{xx} - e_{zz})\}$ must be positive. Therefore the only term in $\pm T$ which has any chance of being negative is $Bb(e_{xx} - e_{zz})$. Since b and B are both negative, it follows that the strain $(e_{xx} - e_{zz})$ must be negative and sufficient to counteract the $2B^2 + C^2$ quantum confinement term. Unfortunately, the quantum confinement acts to partially cancel the effective mass reduction in the highest lying band. Therefore, a large strain is necessary to produce the smallest possible effective mass.

To proceed further we have numerically evaluated the parallel effective mass in x-y plane using equations (6) and (7). In Table I is given an assumed set of numerical co-efficients which are thought to be representative of a quaternary semiconductor with a bandedge near the 1.5 μm wavelength. The resulting strain of, 3.7% is for a semiconductor with the lattice constant of InP grown on a substrate of GaAs. The quantum well was selected to be 100 o/A wide, which is probably the maximum permissible thickness for such a high strain. Even under such extreme conditions the strain barely counteracts the quantum confinement yielding $T=0.9 \, m_e^{-1}$. The effective mass in the plane of the active layer is $m_{||} = -(A+T)^{-1} = 0.07 \, m_e$ where $m_e$ is the free electron mass. This is a considerable improvement but it does not completely fulfill the objective of equal electron and effective masses. Furthermore, the higher quantum confined sublevels represented by $l>1$ are separated from the lowest sublevel $l=1$ by less than kT due to the heavy mass perpendicular to active layer. Therefore, the sublevels with $l>1$ are likely to be populated and add unnecessarily to the injection level and to the threshold current burden. Therefore, although considerable improvement occurs there is room for further improvement.

In conclusion, the effect of a valence band effective mas reduction is to lower the injection level and threshold current requirements in semiconductor laser. If the nonradiative terms in equation (3) can thereby be completely eliminated, the threshold current density will be given by equation (4). In a graded index-separate confinement heterostructure with a single quantum well active layer, g can be 200 cm$^{-1}$ for a net gain in the mode of $\Gamma g = 10$ cm$^{-1}$ which might be enough to overcome losses in a cavity which is 2 mm long. ($\Gamma$ is the mode filling factor assumed to be 0.05 in this instance). Substituting these values into equation (4), the result is that under these ideal circumstances the lasing threshold current density may be as low as 10 or 20 Amps/cm$^2$ compared with the current best technology which is about ten times higher.

While the invention has been illustrated and described as embodied in a process for semiconductor laser fabrication, it is not intended to be limited to the details shown since various modifications and structural changes may be made without departing in any way from the spirit of the present invention.

It will be obvious to those skilled in the art that the process according to the present invention can be implemented with various semiconductor technologies and different combinations of known process steps, and that the preferred embodiments illustrated here are merely exemplary. The thickness of the layers, depth of penetration and gradation in concentration of the various impurities interlayer materials, and in particular the configuration and distance between the various layers, as well as the types of devices to which the process is applied can be chosen depending upon the desired properties. These and other variations can be further elaborated by those skilled in the art without departing from the scope of the present invention.

Without further analysis, the foregoing will so fully reveal the gist of the present invention that others can, by applying current knowledge, readily adapt it for various applications without omitting features that from the standpoint of prior art, fairly constitutes essential characteristics of the generic or specific aspects of this invention, and, therefore, such adaptations should and are intended to be comprehended within the meaning and range of equivalence of the following claims.

TABLE 1

A table of numerical constants representative of a quaternary semiconductor with band edge near the 1.5 μm wavelength.

| | |
|---|---|
| $m_h =$ | $0.25 \, m_e$ |
| $m_c =$ | $0.045 \, m_e$ |
| $A =$ | $-13 \, h^2/2 \, m_e$ |
| $B =$ | $-9 \, h/2 \, m_e$ |
| $|C| =$ | $10 \, h^2/sm_e$ |
| $d =$ | $100$ Å |

TABLE 1-continued

A table of numerical constants representative of a quaternary semiconductor with band edge near the 1.5 μm wavelength.

| | |
|---|---|
| $b =$ | $-2$ eV |
| $e_{xx} =$ | $-0.037$ |
| $e_{zz} =$ | $-2(C_{12}/C_{11})e_{xx}$ |
| $C_{12}/C_{11} =$ | $0.45$ |

What is claimed is:

1. A method of making a semiconductor laser comprising the steps of:

providing a gallium arsenide substrate of a first conductivity type;

depositing a first layer of semiconductor material having the composition $Al_xGa_{1-x}As$ and of said first conductivity type on said substrate, where the Al fraction in said first layer at a first surface of said first layer adjacent to said substrate is approximately between 10% and 50% and grades to approximately 0% at a second opposed surface of said first layer;

depositing on the second surface of said first layer a second layer of semiconductor material for quantum confinement having the composition $In_yGa_{1-y}As$, where the In concentration in said second layer is approximately 50%, the lattice constant of said second layer being sufficiently greater than that of said first layer to establish in said second layer sufficient negative strain with respect to adjoining layers to counteract quantum confinement in said second layer such that the threshold current density of said laser is decreased;

depositing a third layer of semiconductor material having the composition $Al_xGa_{1-x}As$ and of a second conductivity type on said second layer, where the Al fraction in said third layer at a first surface of said third layer adjacent to said second layer is approximately 0% and grades to approximately between 10% and 50% at a second opposed surface of said third layer; and depositing a fourth layer of material comprising gallium arsenide and of said second conductivity type on the second surface of said third layer.

2. A method as defined in claim 1, wherein said step of depositing a second layer of semiconductor material comprises depositing a layer of $In_yGa_{1-y}As$ such that the strain is large enough to significantly reduce the transverse effective mass of the highest lying valence band.

3. A method as defined in claim 1, wherein said step of depositing a second layer of semiconductor material provides a layer less than 100 Angstroms in thickness.

4. A method as defined in claim 1, wherein the strain between the second layer and the adjoining layers is approximately 3.7%.

5. A method of making a semiconductor laser comprising the steps of:

providing a gallium arsenide substrate of a first conductivity type;

depositing a first layer of semiconductor material having the composition $Al_xGa_{1-x}As$ and of said first conductivity type on said substrate, where the Al fraction in said first layer at a first surface of said first layer adjacent to said substrate is approximately between 10% and 50% and grades to approximately 0% at a second opposed surface of said first layer;

depositing on the second surface of said first layer a second layer of semiconductor material for quantum confinement having the composition $In_yGa_{1-y}As$, where the In concentration in said second layer is approximately 50%, said second layer experiencing sufficient strain with respect to adjoining layers such that the laser threshold current density is decreased;

depositing a third layer of semiconductor material having the composition $Al_xGa_{1-x}As$ and of a second conductivity type on said second layer, where the Al fraction in said third layer at a first surface of said third layer adjacent to said second layer is approximately 0% and grades to approximately between 10% and 50% at a second opposed surface of third layer; and depositing a fourth layer of material comprising gallium arsenide and of said second conductivity type on the second surface of said third layer, and further comprising the step of depositing counter-strain layers on either side of said second layer.

6. A method as defined in claim 5, wherein said counter-strain layers each have a thickness of approximately 50 Angstroms and comprise gallium phosphide.

7. A method of making a semiconductor laser comprising the steps of:

providing a gallium arsenide substrate of a first conductivity type;

depositing a first layer of semiconductor material having the composition $Al_xGa_{1-x}As$ of said first conductivity type on said substrate, where the Al fraction is between 0% and 50%, depositing on said first layer a second layer of semiconductor material for quantum confinement having the composition $In_yGa_{1-y}As$, where the In concentration is approximately 50%, the lattice constant of said second layer being sufficiently greater than that of said first layer to establish in said second layer sufficient negative strain with respect to adjoining layers to reduce the transverse effective mass of the highest lying valence band in said second layer;

depositing a third layer of semiconductor material having the composition $Al_xGa_{1-x}As$ and of a second conductivity type on said second layer, where the Al fraction is between 0% and 50%; and depositing a fourth layer of material comprising gallium arsenide and of said second conductivity type on said third layer.

8. A method of making a semiconductor laser comprising the steps of:

providing a substrate made of a III-V semiconductor material;

depositing a first optical waveguiding layer made of a semiconductor material on said substrate;

depositing on said first layer an active layer made of a semiconductor material that includes indium and arsenic as constituent components, the lattice constant of said active layer being sufficiently greater than that of said first layer to establish in said active layer a negative strain that counteracts quantum confinement in said active layer thereby to reduce threshold current density in said laser;

depositing a second optical waveguiding layer made of a semiconductor material on said active layer;

and depositing a third layer made of a III-V semiconductor material on said second optical waveguiding layer.

* * * * *

UNITED STATES PATENT AND TRADEMARK OFFICE
CERTIFICATE OF CORRECTION

PATENT NO. : 4,804,639

DATED : February 14, 1989

INVENTOR(S) : Eli Yablonovitch

Page 1 of 2

It is certified that error appears in the above-identified patent and that said Letters Patent is hereby corrected as shown below:

Column 1, line 18, change "shown" to --known--.

Column 1, line 63, change "lase" to --laser--.

Column 2, line 51, change "$<$" to --$>$--.

Column 3, line 33, change "laeyr" to --layer--.

Column 3, line 37, change "incresaes" to --increases--.

Column 3, line 63, change "quanternary" to --quaternary--.

Column 4, line 15, delete "and".

Column 4, line 35, change "$m_n$" to --$m_h$--.

Column 4, line 49, change "hu$\geq$" to --hw$\geq$--.

Column 4, line 60, add "$\int$" after =.

Column 5, lines 39-41 change "largely independent of any microscopic properties of the analogous to the Einstein A and B relations and which is gain medium:" to --analogous to the Einstein A and B relations and which is largely independent of any microscopic properties of the gain medium.--

UNITED STATES PATENT AND TRADEMARK OFFICE
CERTIFICATE OF CORRECTION

PATENT NO. : 4,804,639
DATED : February 14, 1989
INVENTOR(S) : Eli Yablonovitch

It is certified that error appears in the above-identified patent and that said Letters Patent is hereby corrected as shown below:

Column 5, line 49, add "a" after be.

Column 6, line 39 add "." after where.

Signed and Sealed this

Eleventh Day of September, 1990

Attest:

HARRY F. MANBECK, JR.

*Attesting Officer*     *Commissioner of Patents and Trademarks*